United States Patent
Bhagavatheeswaran et al.

(10) Patent No.: US 7,202,729 B2
(45) Date of Patent: Apr. 10, 2007

(54) METHODS AND APPARATUS TO BIAS THE BACKGATE OF A POWER SWITCH

(75) Inventors: Shanthi Bhagavatheeswaran, Dallas, TX (US); Srinivasan Venkatraman, Dallas, TX (US); Hugh Mair, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/970,601

(22) Filed: Oct. 21, 2004

(65) Prior Publication Data

US 2006/0087361 A1    Apr. 27, 2006

(51) Int. Cl.
*H03K 3/01* (2006.01)
(52) U.S. Cl. ...................... 327/534; 327/544
(58) Field of Classification Search ............... 327/534, 327/537, 544
See application file for complete search history.

(56) References Cited

U.S. PATENT DOCUMENTS 6,252,452 B1 *  6/2001  Hatori et al. ............... 327/544
6,518,825 B2 *  2/2003  Miyazaki et al. ........... 327/534
6,624,660 B2 *  9/2003  Li et al. ........................ 326/83
6,970,024 B1 * 11/2005  Reese et al. ................. 327/112

OTHER PUBLICATIONS

Chun et al., *A PMOSFET ESD Failure Caused by Localized Charge Injection* (date unknown).

* cited by examiner

*Primary Examiner*—Kenneth B. Wells
(74) *Attorney, Agent, or Firm*—Ronald O. Neerings; Wade James Brady, III; Frederick J. Telecky, Jr.

(57) ABSTRACT

Methods and apparatus to bias a backgate of a power switch while preventing latchup are disclosed. A disclosed method of biasing a backgate of a power switch comprises: if a voltage of a first power supply rises before a voltage of a second power supply, initially biasing the backgate with a voltage based on the first power supply; and if the voltage of the first power supply rises after the voltage of the second power supply, biasing the backgate with a voltage based on the second power supply.

31 Claims, 3 Drawing Sheets

METHODS AND APPARATUS TO BIAS THE BACKGATE OF A POWER SWITCH

FIELD OF THE DISCLOSURE

This disclosure relates generally to power supplies, and, more particularly, to methods and apparatus to bias a backgate of a power switch.

BACKGROUND

Power switches are commonly used to couple a power supply to a device such as a digital logic circuit or a memory cell. FIG. 1 illustrates such a prior art power switch 10 coupled to selectively supply power from a core power supply 12 to a device 14 (e.g., a digital logic circuit, a memory cell, etc.). In the illustrated example, the power switch 10 is implemented by a PMOS field effect transistor. The source of the transistor 10 is coupled to the core power supply 12. The drain of the transistor 10 is coupled to the device 14. The gate of the transistor 10 is coupled to a control circuit that applies an on/off drive signal to switch the transistor 10 between a conducting state and a non-conducting state to supply and/or terminate the supply of power to the device 14.

Power switches such as the switch 10 exhibit undesirable standby leakage current. This standby leakage current is primarily attributable to the drain-source leakage current of the power switch 10. To reduce this leakage current, it has recently been proposed to bias the backgate of the power switch 10 with a voltage greater than the voltage supplied to the source of the switch 10. Biasing the backgate of the power switch 10 in this manner effectively increases the turn-on voltage of the switch 10 and dramatically reduces the leakage current through the switch 10 when the switch 10 is off. Indeed, this technique can reduce the leakage current by a factor of fifty.

It is often the case that an integrated circuit will have two available power supplies, namely, a core voltage supply 12 and an input/output (IO) power supply 16. The IO power supply 16 typically produces a higher voltage than the core supply 12. For example, the IO supply 16 of FIG. 1 produces a voltage of 1.8 volts, whereas the core supply 12 of FIG. 1 produces a voltage of 1.3 volts. The circuit of FIG. 1 takes advantage of the presence of these two power supplies by using the core voltage from the core supply 12 to supply power to the device 14 via the transistor 10, and by using the IO voltage from the IO supply 16 to bias the backgate of the transistor 10. However, at startup, one cannot guarantee that the core voltage 12 will ramp-up before the IO voltage 16. Thus, it is possible that the voltage from the core supply 12 will, at least for a time during startup, be greater than the voltage from the IO supply 16. If the ramp-up sequence of the core supply 12 and the IO supply 16 is such that the core voltage supplied to the source of the transistor 10 sufficiently exceeds the IO voltage applied to the backgate, an undesirable latchup condition can arise.

More specifically, as shown in FIG. 2, the transistor 10 and the device 14 may be formed in the same silicon substrate. Even if proper high voltage spacing between the switch 10 and the device 14 is employed, the well-to-well spacing in such a circuit may be low. Further, no guard ring is placed around the switch 10. As a result, if the core voltage 12 rises more quickly than the IO voltage 16, the pn junction between the source and the substrate/well 20 of the switch 10 may become forward biased. As a result, a latchup condition may occur wherein, instead of current flowing in the desired current path 18 from the source to the drain, the current injected into the substrate/well 20 flows directly into the well of the device 14 via, for example, current path 22. Such a latchup condition may result in damage to the device 14, the switch 10 and/or the power supply 12. Even if no damage results, the device 14 is likely to malfunction. Further, once a latchup condition occurs, it is difficult, if not impossible, to cause the switch 10 to operate properly (i.e., with current flowing from source to drain via path 18) without resetting the device by disconnecting power.

DETAILED DESCRIPTION

Figure 1:
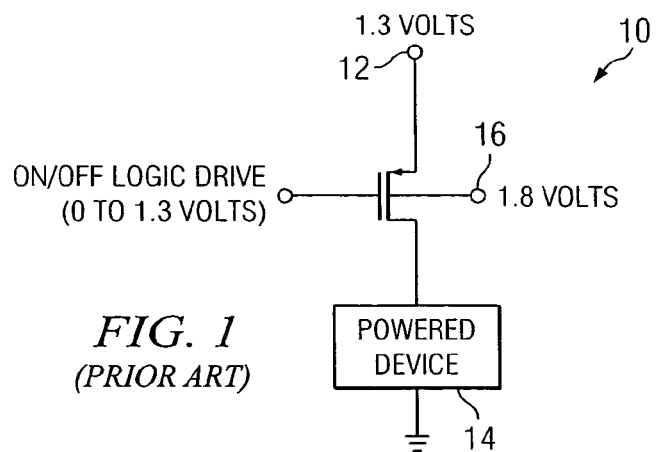
FIG. 1 is a schematic illustration of a prior art power switch to deliver power to a device.
Figure 2:
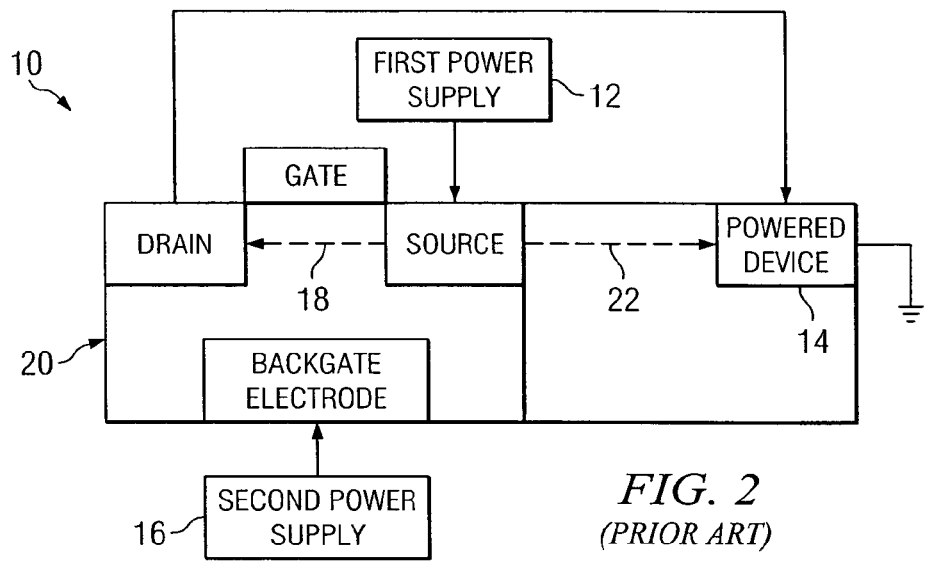
FIG. 2 is a more detailed schematic illustration of the power switch of FIG. 1.
Figure 3:
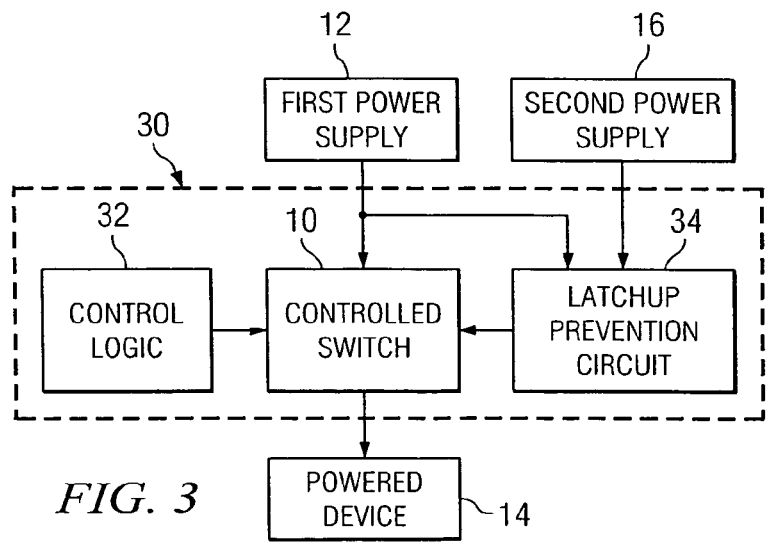
FIG. 3 is a schematic illustration of an example power supply circuit including a latchup prevention circuit to bias the backgate of a controlled switch to reduce leakage current.

An example circuit 30 constructed in accordance with the teachings of the invention to supply power to a powered device 14 is shown in FIG. 3. Some of the structures shown in FIG. 3 may be identical to corresponding structures illustrated in FIGS. 1 and 2. For example, the circuit 30 of FIG. 3 includes a controlled switch 10 which may be identical to the switch 10 of FIGS. 1 and 2. Similarly, the first power supply 12 of the example of FIG. 3 may be implemented by the core power supply 12 of FIGS. 1 and 2, the second power supply 16 of the example of FIG. 3 may be implemented by the IO power supply 16 of FIGS. 1 and 2, and the powered device 14 of FIG. 3 may correspond to the device 14 of FIGS. 1 and 2. In the interest of brevity, a description of these structures will not be repeated. Instead, the interested reader is invited to refer to the earlier description of these structures for a complete discussion of the same. To facilitate this process, like reference numerals are used to refer to like structures throughout the drawings and the accompanying description.

As with the prior art circuit discussed above, the controlled switch 10 is responsive to a control signal (e.g., a logic drive signal from 0 to 1.3 volts) from a control circuit 32 to switch between a conducting state and a non-conducting state. When in the conducting state, the controlled switch 10 delivers power from the first power supply 12 to the powered device 14. When in the non-conducting state, the switch 10 substantially prevents the flow of current from the first power supply to the powered device 14. Although for simplicity of discussion only one controlled switch 10 and one powered device 14 are shown and described, persons of ordinary skill in the art will readily appreciate that more than one switch 10 and/or more than one device 14 may alternatively be employed.

For the purpose of reducing and/or substantially preventing leakage current, a bias voltage is applied to the backgate of the controlled switch 10. In the example of FIG. 3, this bias voltage is provided by a latchup prevention circuit 34.

The latchup prevention circuit 34 controls the bias voltage applied to the backgate of the controlled switch 10 to prevent latchup of the controlled switch 10. In particular, the latchup prevention circuit 34 is responsive to the sequence in which the voltages of the first power supply 12 and the second power supply 16 rise upon startup to ensure that the difference between the voltage applied to the backgate and the voltage applied to the source of the switch 10 does not drive the switch 10 into a latchup condition. In other words, the latchup prevention circuit 34 is structured to ensure that the controlled switch 10 will not be driven into latchup irrespective of the sequence in which the voltages of the first and second power supplies 12, 16 rise.

More specifically, if upon startup, the voltage of the first power supply 12 rises before the voltage of the second power supply 16, there is a risk of driving the controlled switch 10 into latchup. Therefore, the bias voltage initially applied to the backgate by the latchup prevention circuit 34 is based on the voltage of the first power supply 12. Since, in the illustrated example, the second power supply 16 is able to supply a higher voltage than the first power supply 12 in a steady state condition, biasing the backgate with a voltage based on the second power supply 16 will result in a greater reduction in leakage current than biasing the backgate with a voltage based on the first power supply 12. Consequently, whenever possible, it is preferred to bias the backgate with the higher voltage available from the second power supply 16. Accordingly, after the voltage of the second power supply 16 has reached a steady state and/or the voltage of the second power supply 16 has exceeded the voltage of the first power supply 12, the threat of driving the controlled switch 10 into latchup is no longer present and, thus, the voltage applied to the backgate by the latchup prevention circuit 34 is based on the voltage of the second power supply 16.

On the other hand, if at startup, the voltage of the first power supply 12 rises after the voltage of the second power supply 16, there is no concern that employing the voltage of the second power supply 16 will drive the controlled switch 10 into latchup. Therefore, in this circumstance, rather than using the voltage from the first power supply 12 to initially bias the backgate, the bias voltage applied to the backgate by the latchup prevention circuit 34 is immediately based on the voltage of the second power supply 16.

Figure 4:
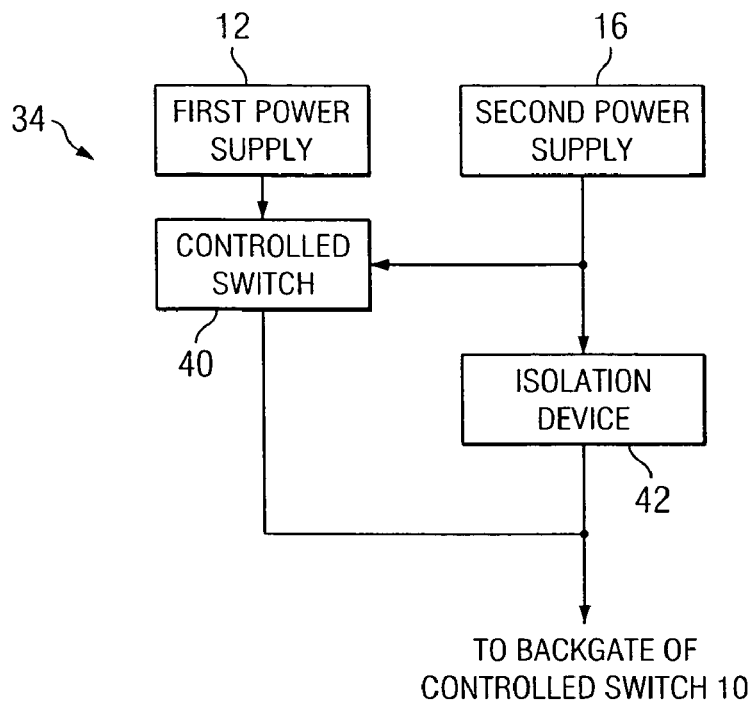
FIG. 4 is a schematic illustration of an example latchup prevention circuit which may be used in the circuit of FIG. 3.

An example latchup prevention circuit 34 is shown in greater detail in FIG. 4. In the example of FIG. 4, the latchup prevention circuit 34 includes a controlled switch 40 to couple a voltage from the first power supply 12 to the backgate of the controlled switch 10 if the voltage of the first power supply 12 rises before the voltage of a second power supply 16. In the illustrated example, the controlled switch 40 is a voltage controlled switch which has a control terminal coupled to the second power supply 16. When the voltage of the second power supply 16 is below a threshold level, the controlled switch 40 is in a conducting state such that a voltage from the first power supply 12 is applied to the backgate of the controlled switch 10. When, however, the voltage of the second power supply 16 rises above the threshold level, the controlled switch 40 is switched to a non-conducting state, thereby effectively disconnecting the first power supply 12 from the backgate.

In the example of FIG. 4, the latchup prevention circuit 34 also includes an isolation device 42 to couple a voltage from the second power supply 16 to the backgate of the controlled switch 10. The isolation device 42 is coupled between the second power supply 16 and the backgate of the switch 10, and ensures that the voltage from the second power supply 16 is applied to the backgate whenever the voltage of the second power supply 16 is sufficiently high to drive the controlled switch 40 into the non-conducting state. The isolation device 42 also ensures that current flowing from the first power supply 12 and out of the controlled switch 40 does not flow back into the second power supply 16.

In operation, whenever the voltage from the second power supply 16 is sufficiently low to turn on the controlled switch 40, the voltage from the first power supply 12 is applied to the backgate of the controlled switch 10. As a result, whenever the voltage of the first power supply 12 rises before the voltage of the second power supply 16, the voltage applied to the backgate by the circuit 34 of FIG. 4 will be the voltage from the first power supply 12. Therefore, in these circumstances, since the voltage from the first power supply 12 is applied to both the source and the backgate of the controlled switch 10, the pn junction between the source and the backgate of the switch 10 will not be sufficiently forward biased to cause current injection and/or latchup.

Subsequently, when the voltage of the second power supply 16 rises sufficiently to shut off the controlled switch 40, the first power supply 12 will be disconnected from the backgate and, thus, the voltage applied to the backgate will be from the second power supply 16. When, however, the voltage from the second power supply 16 is sufficient to turn off the switch 40, the voltage applied by the second power supply 16 will also be sufficient to ensure that the pn junction between the source and the backgate of the controlled switch 10 will be reversed biased or, at least will not be sufficiently forward biased to cause significant current injection and/or latchup.

If, on the other hand, the voltage of the first power supply 12 rises after the voltage of the second power supply 16, the controlled switch 40 will be switched off and the voltage applied to the backgate by the circuit 34 of FIG. 4 will be the voltage from the second power supply 16. Because, in this scenario, the voltage from the second power supply 16 has risen before the voltage from the first power supply 12, by definition, the voltage from the second power supply 16 (i.e., the voltage applied to the backgate of the switch 10) is greater than the voltage from the first power supply 12 (i.e., the voltage applied to the source of the switch 10). Consequently, the pn junction between the source and the backgate of the controlled switch 10 will be reversed biased and there is no risk that the switch 10 will latchup.

Figure 5:
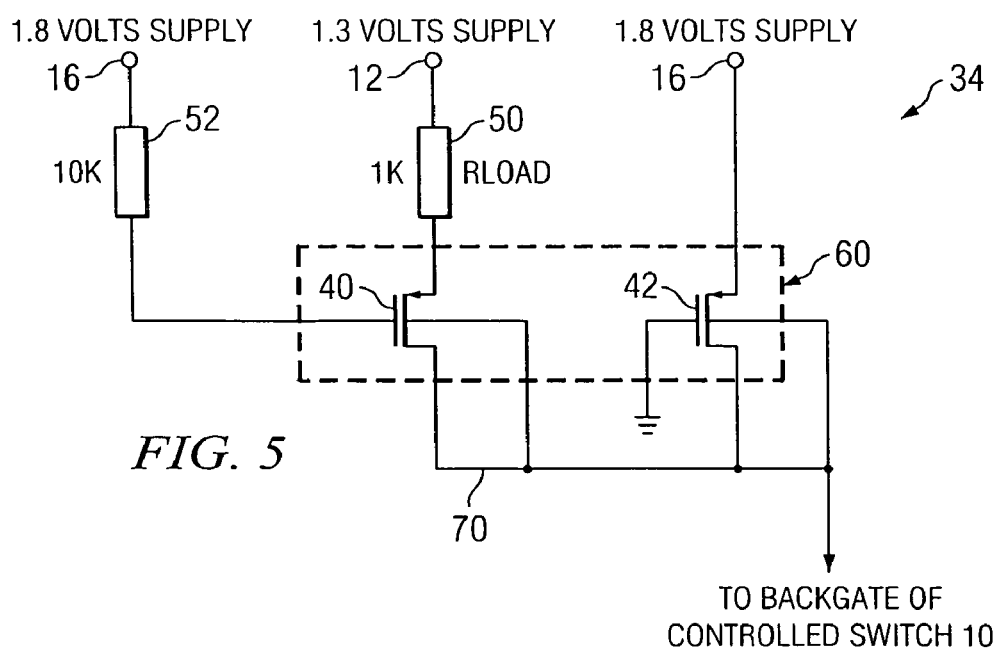
FIG. 5 is a circuit diagram illustrating an example manner of implementing the latchup prevention circuit of FIG. 4.

An example manner of implementing the latchup prevention circuit 34 of FIG. 4 is shown in FIG. 5. In the example of FIG. 5, the controlled switch 40 is implemented by a PMOS field effect transistor. As is conventional, the PMOS transistor 40 includes a source, a drain, a gate and a backgate. The source of the example transistor 40 of FIG. 5 is coupled to the first power supply 12 via a current limiting resistor 50. In the illustrated example, the current limiting resistor 50 is a 1 K ohm resistor. The resistor 50 is selected to limit the initial current magnitude passing through the switch 40 to a small value in the event the voltage of the first power supply 12 rises before the voltage of the second power supply 16 to thereby reduce the possibility of latchup. However, current injection into the well of the transistor 40 is likely to occur. Precautions to ensure the carriers flooding the well due to such current injection do not leave the well (e.g., do not reach the switch 10 or the powered device 14) are discussed further below.

The gate of the example transistor 40 of FIG. 5 is coupled to the second power supply 16 via a current limiting resistor 52. In the illustrated example, the resistor 52 is a 10 K ohm resistor.

The drain and the backgate of the example transistor 40 of FIG. 5 are coupled together and to the backgate of the controlled switch 10. The backgate of the transistor 40 is tied to the drain rather than the source to prevent forward biasing of the pn junction between the source and the backgate of the transistor 40.

As will be appreciated by persons of ordinary skill in the art, the isolation device 42 may be implemented by a diode. However, for fabrication efficiency, in the example of FIG. 5, the isolation device 42 is implemented by a PMOS field effect transistor having its gate coupled to ground. As will be appreciated by persons of ordinary skill in the art, coupling the gate to ground ensures that the transistor 42 is always in a conducting state in which current passes from source to drain.

As shown in FIG. 5, in addition to the above-mentioned gate, the transistor 42 includes a drain, a source and a backgate. The source of the transistor 42 is coupled to the second power supply. The drain and the backgate of the transistor 42 are coupled to one another and to the backgate of the controlled switch 10. The transistors 40, 42 may be formed in a common well.

As mentioned above, it is possible for the transistor 40 and/or the transistor 42 to exhibit substrate current injection. Indeed, the well(s) of the transistors 40, 42 will usually be flooded with forward injection carriers. To ensure that the excess carriers injected into the well(s) of the latchup prevention circuit 34 do not travel to other parts of the circuit and/or cause latchup, a guard ring 60 is located around the transistors 40, 42 of the circuit 34. In the example of FIG. 5, the transistors 40, 42 share a common well. Therefore, the guard ring 60, which is preferably implemented as a double guard ring, is located around both transistor 40, 42. However, persons of ordinary skill in the art will appreciate that multiple guard rings, (for example, a first double guard ring located around the transistor 40 and a second double guard ring located around the transistor 42), may alternatively be employed. Although the guard ring(s) 60 effectively isolate the excess carriers from the remainder of the circuit, placing the other circuit elements away from the latchup prevention circuit 34 is recommended.

Figure 6:
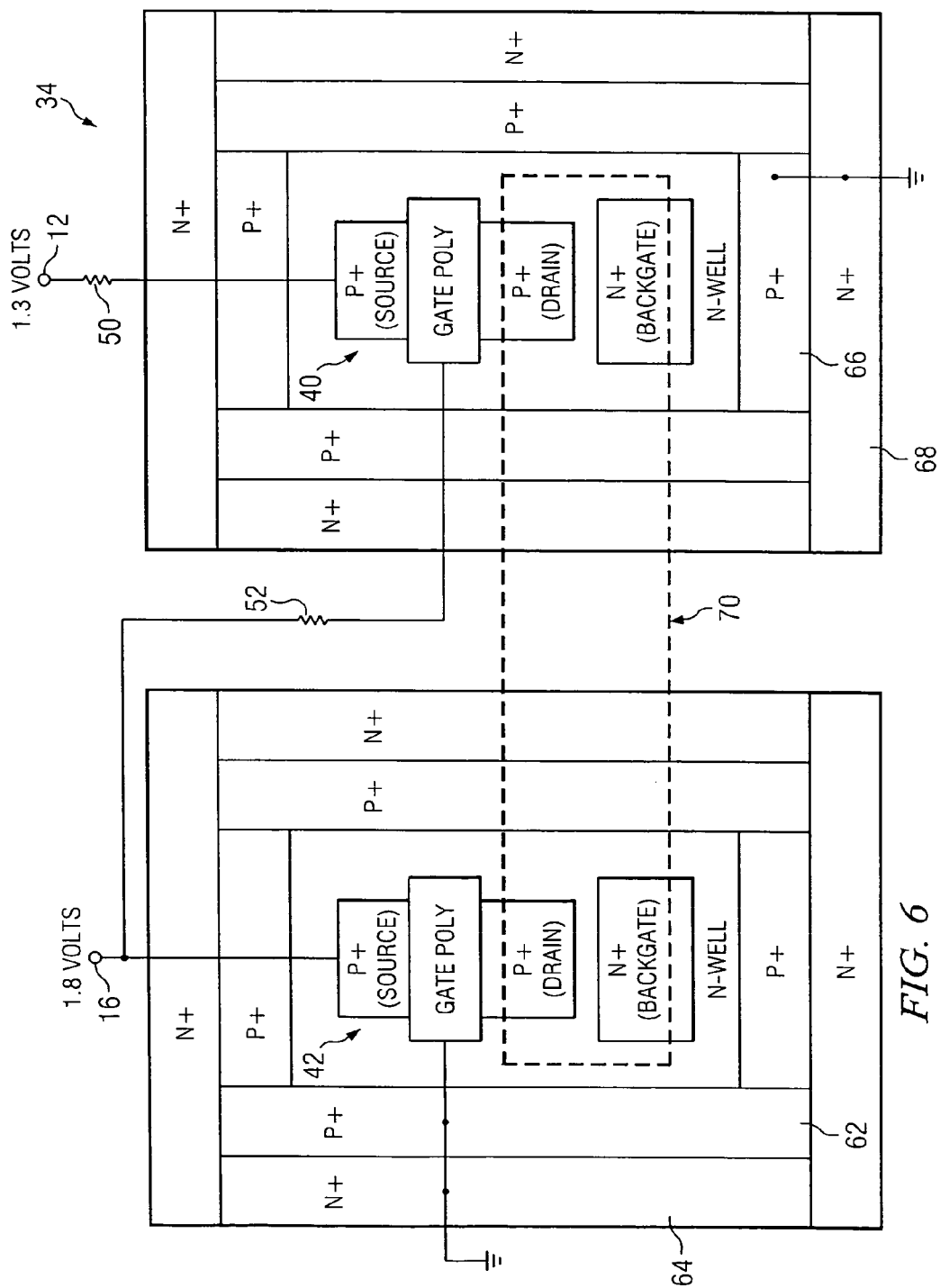
FIG. 6 is a more detailed illustration of the example latchup prevention circuit of FIG. 5.

An example manner of implementing the circuit of FIG. 5 is shown in FIG. 6. In the example of FIG. 6, each transistor 40, 42 is surrounded by a double guard ring. Specifically, the transistor 42 is surrounded by a P+ guard ring 62 which, in turn, is surrounded by an N+ guard ring 64. The guard rings 62, 64 are electrically coupled to one another and to ground. Similarly, the transistor 40 is surrounded by a P+ guard ring 66 which, in turn, is surrounded by an N+ guard ring 68. The guard rings 66, 68 are electrically coupled to one another and to ground.

In the example of FIG. 6, each transistor 40, 42 is located in an N-well. These wells are electrically coupled via the thick metal line/connector 70 which ties the drains and backgates of the transistors 40, 42 to each other and to the backgate of the controlled 10 (see FIG. 5). In this implementation, the wells of the transistors 40, 42 are permitted to float with the power supplies 12, 16 such that whichever power supply 12, 16 rises first at startup, initially pulls up the voltage of the wells.

Persons of ordinary skill in the art will appreciate that various methods for biasing the backgate of a current reduction switch have been disclosed herein. For example, a disclosed method of biasing the backgate of a power switch comprises: if a voltage of a first power supply rises before a voltage of a second power supply, initially biasing the backgate with a voltage based on the first power supply; and if the voltage of the first power supply rises after the voltage of the second power supply, biasing the backgate with a voltage based on the second power supply. After the voltage of the second power supply exceeds the voltage of the first power supply and/or after the voltage of the second power supply reaches a steady state, the backgate may be biased with a voltage based on the second power supply.

Further, another disclosed method of biasing a backgate of a power switch comprises: delivering a voltage based on a first power supply to the backgate when a controlled switch is in an on state; and delivering a voltage based on a second power supply to a backgate when the controlled switch is in an off state. The state of the controlled switch is selected by a voltage from the second power supply.

From the foregoing, persons of ordinary skill in the art will further appreciate that the above disclosed methods and apparatus achieve significant reduction (e.g., a factor of fifty) in the leakage current of the power switch 10, while permitting the usage of any power-up sequence of the first and second power supplies 12, 16. This leakage current reduction is achieved while preventing latchup from occurring in the controlled switch 10. Further, the disclosed methods and apparatus isolate and contain any substrate injection occurring due to the power sequence transients associated with start up to within the latchup prevention circuit 34.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A supply circuit to supply power to a device, comprising:
   a controlled power switch responsive to a control signal to deliver power to the device, the controlled switch having a backgate; and
   a circuit to control a bias voltage applied to the backgate of the controlled switch to prevent latchup of the controlled switch, wherein if a voltage of a first power supply rises before a voltage of a second power supply, the bias voltage initially applied to the backgate is based on the voltage of the first power supply, and if the voltage of the first power supply rises after the voltage of the second power supply, the bias voltage initially applied to the backgate is based on the voltage of the second power supply.

2. A circuit as defined in claim 1, wherein if the voltage of the first power supply rises before the voltage of the second power supply, the voltage applied to the backgate is based on the voltage of the second power supply after the voltage of the second power supply exceeds the voltage of the first power supply.

3. A circuit as defined in claim 1, wherein if the voltage of the first power supply rises before the voltage of the second power supply, the voltage applied to the backgate is based on the voltage of the second power supply after the voltage of the second power supply has reached a steady state.

4. A circuit as defined in claim 1, wherein the circuit to control the bias voltage applied to the backgate comprises a controlled switch to selectively couple the voltage of the first power supply to the backgate.

5. A circuit as defined in claim 4, wherein the controlled switch has an input coupled to the second power supply.

6. A circuit as defined in claim 4, further comprising a guard ring disposed around the controlled switch.

7. A circuit as defined in claim 6, wherein the guard ring is a double guard ring.

8. A circuit as defined in claim 1, further comprising a guard ring disposed around the circuit to isolate injection current.

9. A circuit as defined in claim 4, wherein the controlled switch includes a source, a drain, a gate and a backgate, the source is coupled to the first power supply, the gate is coupled to the second power supply, and the drain and the backgate are coupled together.

10. A circuit as defined in claim 9, further comprising a current limiting resistor coupled to the source and the first power supply.

11. A circuit as defined in claim 4, further comprising an isolation device coupled between the second power supply and the backgate.

12. A circuit as defined in claim 11, wherein the isolation device comprises a PMOS field effect transistor having a gate coupled to ground.

13. A circuit to supply power to a device, comprising:
   a controlled power switch responsive to a control signal to deliver power to the device, the controlled switch having a backgate; and
   a circuit to control a bias voltage applied to the backgate of the controlled switch to prevent latchup of the controlled switch, wherein the circuit to control the bias voltage applied to the backgate comprises a controlled switch to selectively couple the voltage of the first power supply to the backgate, and the input of the controlled switch is coupled to the second power supply via a resistor.

14. A circuit to supply power to a device, comprising:
   a controlled power switch responsive to a control signal to deliver power to the device, the controlled switch having a backgate;
   a circuit to control a bias voltage applied to the backgate of the controlled switch to prevent latchup of the controlled switch, wherein the circuit to control the bias voltage applied to the backgate comprises a controlled switch to selectively couple the voltage of the first power supply to the backgate, and
   a transistor coupled to the second power supply and the backgate of the controlled power switch.

15. A circuit as defined in claim 14, wherein the transistor includes a gate, a drain, a source and a backgate, the source of the transistor is coupled to the second power supply, the drain and the backgate of the transistor are coupled to one another, and the gate of the transistor is coupled to ground.

16. A circuit as defined in claim 14, further comprising a guard ring disposed around the transistor.

17. A circuit as defined in claim 16, wherein the guard ring is a double guard ring.

18. A circuit to supply voltage to a backgate of a power switch comprising:
   a controlled switch to couple a voltage of a first power supply to the backgate if the voltage of the first power supply rises before a voltage of a second power supply, and to block the voltage of the first power supply from the backgate when the voltage of the second power supply exceeds a predetermined level; and
   an isolation device to couple the voltage of the second power supply to the backgate.

19. A circuit as defined in claim 18, wherein the controlled switch has an input coupled to the second power supply.

20. A circuit as defined in claim 18, further comprising a guard ring disposed around the controlled switch.

21. A circuit as defined in claim 20, wherein the guard ring is a double guard ring.

22. A circuit as defined in claim 18, wherein the isolation device comprises a transistor coupled between the second power supply and the backgate.

23. A circuit as defined in claim 22, further comprising a guard ring disposed around the transistor.

24. A circuit as defined in claim 23, wherein the guard ring is a double guard ring.

25. A circuit to supply voltage to a backgate of a power switch comprising:
   a controlled switch to couple a voltage of a first power supply to the backgate if the voltage of the first power supply rises before a voltage of a second power supply; and
   an isolation device to couple a voltage of the second power supply to the backgate, wherein the controlled switch includes a source, a drain, a gate and a backgate, the source is coupled to the first power supply, the gate is coupled to the second power supply, and the drain and the backgate are coupled together.

26. A circuit as defined in claim 25, further comprising a current limiting resistor coupled to the source and the first power supply.

27. A circuit to supply voltage to a backgate of a power switch comprising:
   a controlled switch to couple a voltage of a first power supply to the backgate if the voltage of the first power supply rises before a voltage of a second power supply; and
   an isolation device to couple a voltage of the second power supply to the backgate, wherein the isolation device comprises a PMOS field effect transistor having a gate coupled to ground.

28. A circuit to supply voltage to a backgate of a power switch comprising:
   a controlled switch to couple a voltage of a first power supply to the backgate if the voltage of the first power supply rises before a voltage of a second power supply; and
   an isolation device to couple a voltage of the second power supply to the backgate, wherein the isolation device comprises a transistor coupled between the second power supply and the backgate, and the transistor includes a gate, a drain, a source and a backgate, the source is coupled to the second power supply, the drain and the backgate are coupled to one another, and the gate is coupled to ground.

29. A method of biasing a backgate of a power switch comprising:
   if a voltage of a first power supply rises before a voltage of a second power supply, initially biasing the backgate with a voltage based on the first power supply; and
   if the voltage of the first power supply rises after the voltage of the second power supply, biasing the backgate with a voltage based on the second power supply.

30. A method as defined in claim 29, wherein if the voltage of the first power supply rises before the voltage of the second power supply, biasing the backgate with a voltage based on the second power supply after the voltage of the second power supply exceeds the voltage of the first power supply.

31. A method as defined in claim 29, wherein if the voltage of the first power supply rises before the voltage of the second power supply, biasing the backgate with a voltage based on the second power supply after the voltage of the second power supply reaches a steady state.

* * * * *